United States Patent [19]

Houdre et al.

[11] Patent Number: 5,684,817
[45] Date of Patent: Nov. 4, 1997

[54] SEMICONDUCTOR LASER HAVING A STRUCTURE OF PHOTONIC BANDGAP MATERIAL

[75] Inventors: Romuald Houdre, Suisse; Claude Weisbuch, Paris; Vincent Berger, Orsay, all of France

[73] Assignee: Thomson-CSF, Paris, France

[21] Appl. No.: 640,525

[22] Filed: May 1, 1996

[30] Foreign Application Priority Data

May 12, 1995 [FR] France ................. 95 05660

[51] Int. Cl.$^6$ ................. H01S 3/0941
[52] U.S. Cl. ................. 372/45; 372/50; 372/92; 372/99
[58] Field of Search ................. 372/45, 46, 96, 372/92, 50, 99

[56] References Cited

U.S. PATENT DOCUMENTS

| | | |
|---|---|---|
| 4,503,447 | 3/1985 | Iafrate et al. ................. 357/16 |
| 4,792,959 | 12/1988 | Mueller et al. ................. 372/46 |
| 5,055,422 | 10/1991 | Weisbuch et al. ................. 437/129 |
| 5,081,634 | 1/1992 | Weisbuch et al. ................. 372/45 |
| 5,187,715 | 2/1993 | Weisbuch et al. ................. 372/46 |
| 5,332,681 | 7/1994 | Tonucci et al. ................. 437/16 |
| 5,365,541 | 11/1994 | Bullock . | |

FOREIGN PATENT DOCUMENTS

WO 94/16345  7/1994  WIPO .

OTHER PUBLICATIONS

Wendt et al. "Nanofabrication of photonic lattice structures in GaAs/AlGaAs", J. Vac.Sci. Technol.B. vol. 11, pp. 2637–2640, Dec. 1993.

Patent Abstracts of Japan, vol. 012, No. 221 (E–625), Jun. 23, 1988 & JP-A-63 016690 (Fujitsu Ltd), Jan. 23, 1988, abridged.

Patent Abstracts of Japan, vol. 012, No. 244 (E–631), Jul. 9, 1988 & JP-A-63 032983 (Mitsubishi Electric Corp), Feb. 12, 1988, abridged.

T. Krauss, et al. "Fabrication of 2–D Photonic Bandgap Structures in GaAs/AlGaAs", *Electronics Letters*, vol. 30, No. 17, Aug. 18, 1994, pp. 1444–1446.

E. Yablonovitch, et al. "Photonic Band Structure: The Face–Centered–Cubic Case Employing Nonspherical Atoms", *Physical Review Letters*, vol. 67, No. 17, Oct. 21, 1991, pp. 2295–2298.

*Primary Examiner*—Rodney B. Bovernick
*Assistant Examiner*—Ellen Kang
*Attorney, Agent, or Firm*—Oblon, Spivak, McClelland, Maier & Neustadt, P.C.

[57] ABSTRACT

Disclosed is a semiconductor laser that is constituted by at least one active layer sandwiched between two confinement layers with P and N type doping to constitute a PN junction. In at least one of the confinement layers and/or the active layer, holes are designed on each side of the cavity so as to form structures of photonic bandgap material along the lateral walls of the cavity and the ends of the cavity.

11 Claims, 3 Drawing Sheets

SEMICONDUCTOR LASER HAVING A STRUCTURE OF PHOTONIC BANDGAP MATERIAL

BACKGROUND OF THE INVENTION

The invention relates to a semiconductor laser and especially to a laser with lateral optical confinement made by means of a material having a structure with a photonic bandgap.

The invention can be applied especially to the making of surface-emitting semiconductor laser matrices. In this case, it enables a the use of a manufacturing technology that is simpler to implement than the one presently used and that has greater efficiency.

Photonic bandgap materials have appeared recently in the literature: these are materials in which the dielectric function is structured periodically, in several dimensions, which is why they are also called photonic crystals. A description of such a material may be found in E. Yablonovitch, "Photonic Crystals", in *Journal of Modern Optics*, 1994, Vol. 41, No. 2, pp. 173–194. According to the technology described in this article, a material of this kind can be made by drilling holes into a substrate in several directions (see pages 183 and 186 of this article). As shown in FIG. 1, a series of three holes are drilled are drilled into the surface of a substrate. The axes of these three holes pass through the same point. These three holes each form an angle of 35° with the normal to the plane of the substrate and form equal angles with one another (see FIG. 1). The rest of the substrate which remains between the holes may then be likened to a hexagonal crystalline structure. It is clearly possible to make other types of structures of photonic bandgap materials having different patterns.

The function of such a structure enables the making of dielectric mirrors.

SUMMARY OF THE INVENTION

The invention relates to the making of a laser that brings photonic-bandgap materials into play.

The laser therefore relates to a semiconductor laser comprising at least one active layer sandwiched between two confinement layers, namely one layer with P doping and one layer with N doping to form a PN junction, wherein said laser comprises, in at least one of the confinement layers and/or the active layer, holes positioned on each side of the cavity so that structures of photonic bandgap material are made along the lateral walls of the cavity and at the ends of the cavity.

BRIEF DESCRIPTION OF THE DRAWINGS

The different objects and characteristics of the invention shall appear more clearly from the following description and from the appended figures, of which.

MORE DETAILED DESCRIPTION

The invention relates to the transversal optical confinement of a semiconductor laser by means of a photonic bandgap material. A diagram showing the principle of such a structure is given in FIG. 2a.

A substrate 5 has, on a main face, a stack of the following layers:

a first P doped confinement layer 2;

a laser active layer 1;

a second N doped confinement layer 3;

a contact layer.

Starting from the upper face of the structure, holes have been drilled so as to make a photonic bandgap material on each side of the laser (zones g1 and g2) and at the ends of lasers (mirrors M1 and M2).

A 2D photonic bandgap material suffices, for the optical mode is confined in the third direction (the thickness of the laser) by the multilayer structure made during the growth of the laser, as in a standard laser. The reflection coefficient of the mirrors M1, M2 placed at the ends of the laser may be matched at will by changing the number of periods of the photonic bandgap material. This number is not necessarily a whole number, the mirror being possibly interrupted on a fraction of a period of the photonic crystal. In the example of FIG. 2, the laser emits its power towards the right, for the right-hand mirror M2 has been designed so that it is less reflective than the left-hand mirror M1 as it contains a smaller number of periods.

The photonic bandgap material located on each side of the laser in the zones g1 and g2 determines the lateral guidance of the guide and forms a guidance strip G in the guide.

Figure 1:
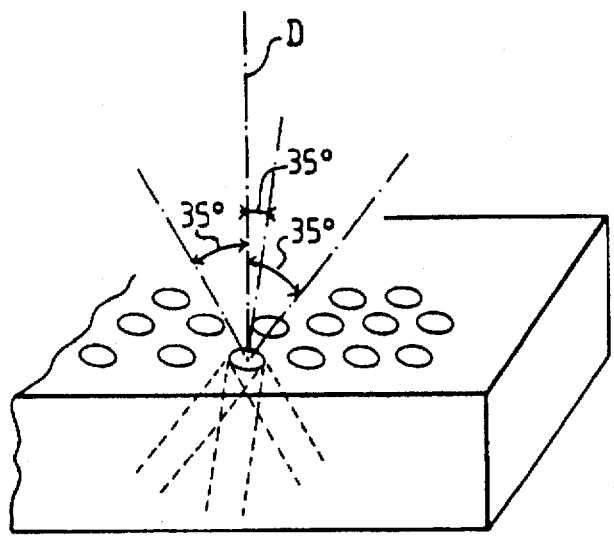
FIG. 1 shows an exemplary embodiment of a photonic bandgap material.
Figure 2A:
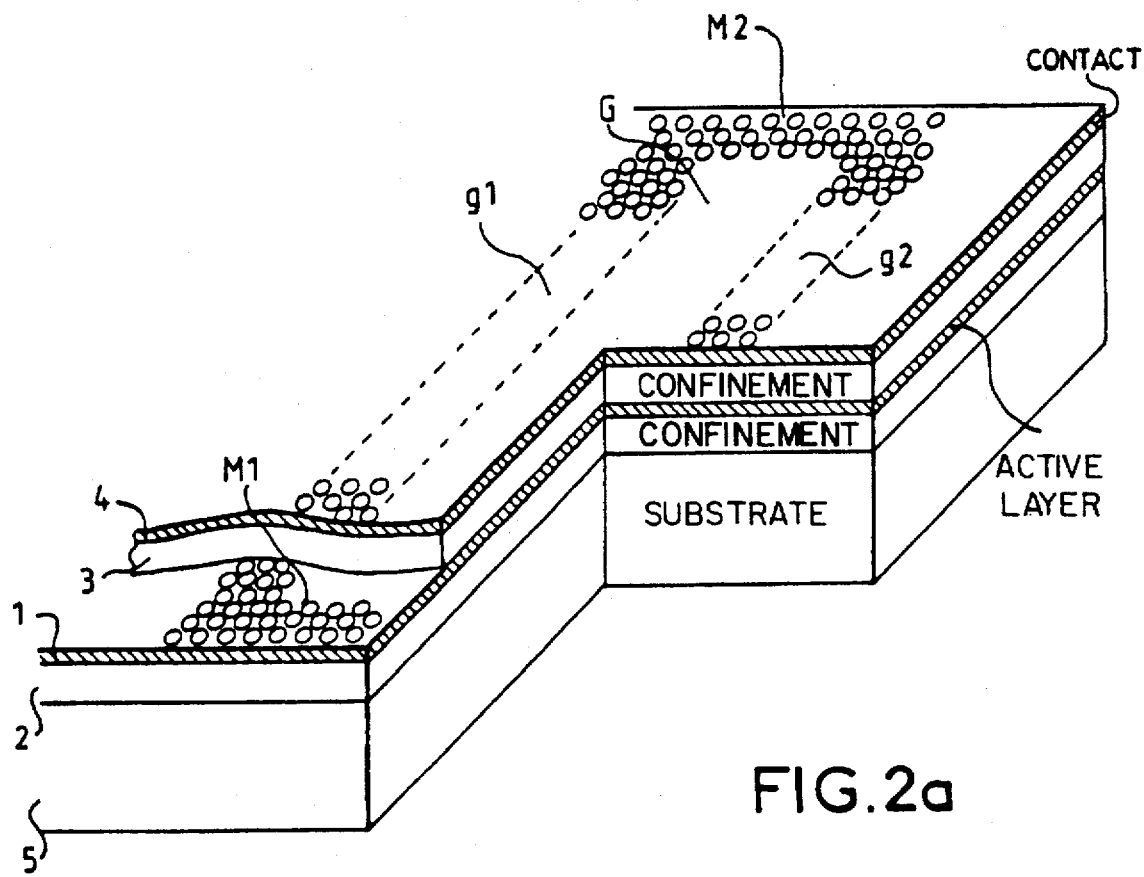
FIG. 2a shows an exemplary laser according to the invention.
Figure 2B:
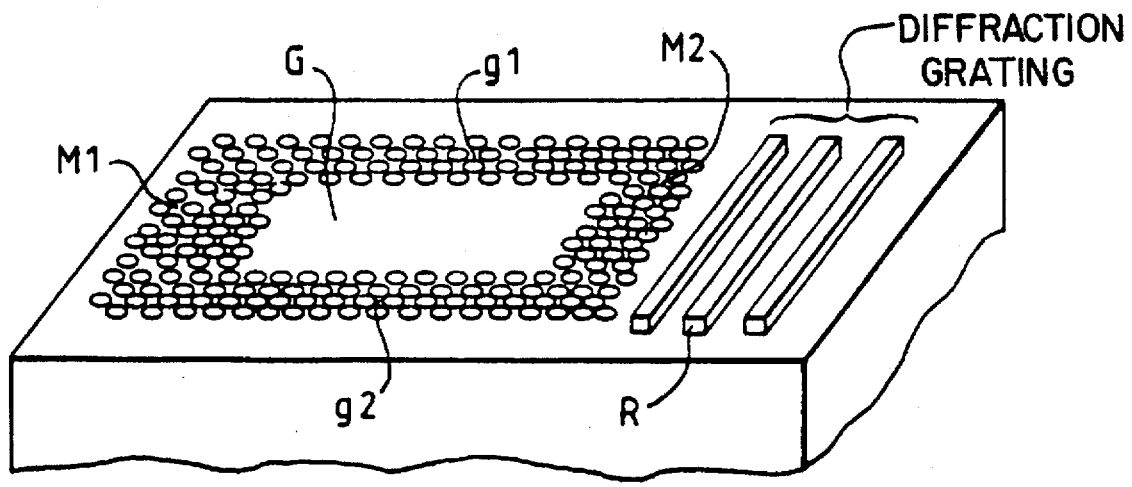
FIG. 2b shows a variant of the laser of FIG. 2a enabling surface emission.

FIG. 2b shows an alternative embodiment of the invention relating to a surface transmission laser.

At the output of the laser, on the mirror M2 side, the light is oriented towards the surface of the structure by means of a diffraction grating R.

Figure 2C:
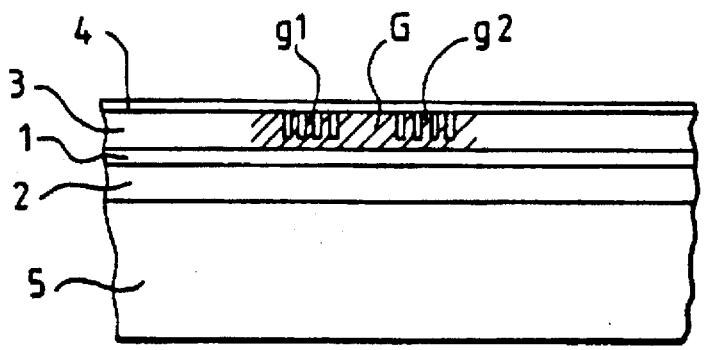
FIG. 2c shows a sectional view of the lasers of FIGS. 2a and 2c.

FIG. 2c shows a sectional view of the laser of FIGS. 2a and 2b.

The holes that form the photonic bandgap material of the guidance zones g1, g2 and of the mirrors M1, M2 may have a square, circular, polygonal or other cross-section.

As for the depth of these holes, the greater it is, the greater will be the efficiency of guidance (or of reflection) of light. When the holes go through the active layer 1, the efficiency is the maximum. Whatever the case, the depth of the holes will be chosen so that the distance from the bottom of the holes to the active layer will be smaller than the wavelength of the laser (i.e. smaller than some tenths of a micrometer).

Preferably, the holes are voided of all material so as to provide a high contrast of index between the photonic bandgap material and the material located on either side of it.

The different holes have a regular arrangement so as to form a regular network. The meshes of this network therefore have a regular form which may be square or hexagonal in particular.

The holes of the different meshes will have sizes such that the holes fill about 70% of the surface (generally from 10% to 90%). Furthermore, the interhole distance is such that $a = 0.2$ to $0.5\ \lambda$ (for example $a = 0.36\ \lambda$ and the filling rate is 70%), a being the distance between holes and $\lambda$ being the wavelength (see *Solid State Electronics* 37, 1341–1994).

Figure 3A:
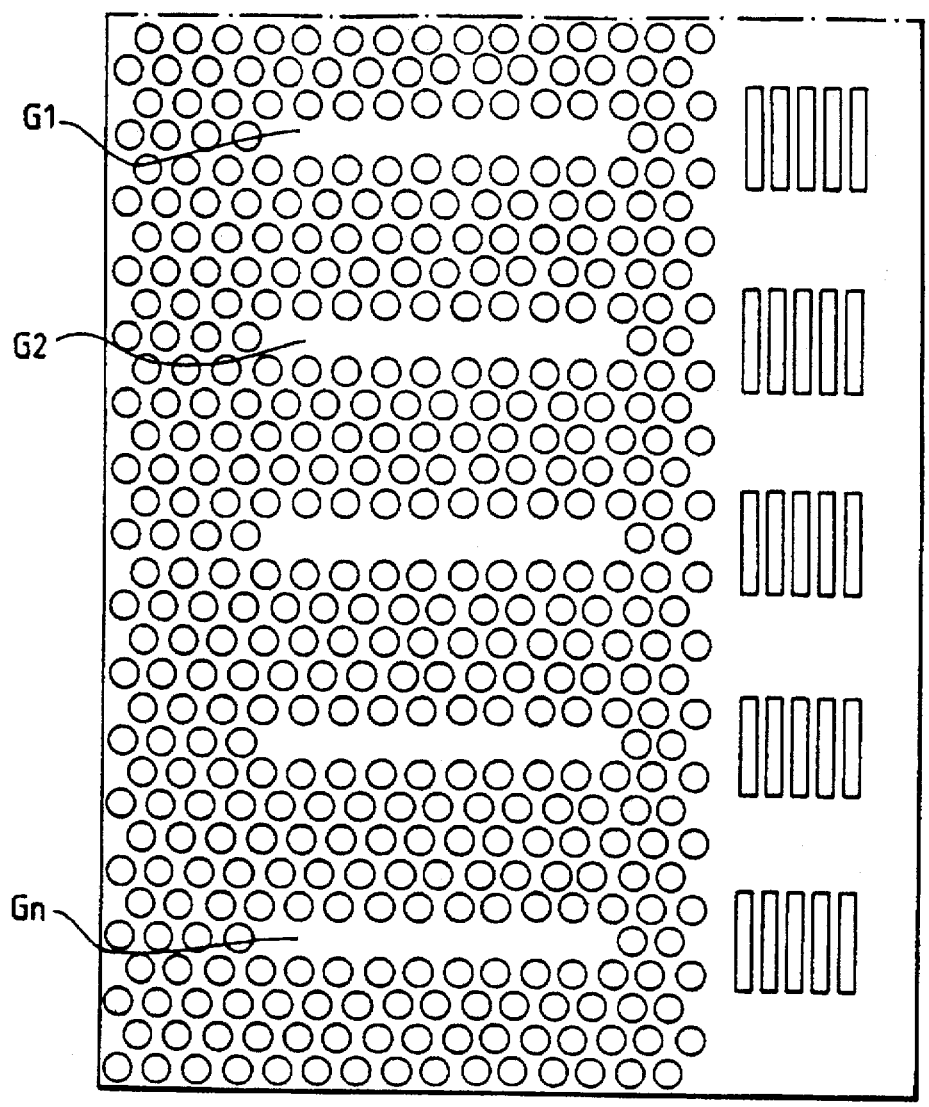
FIGS. 3a and 3b show a set of lasers.
Figure 3B:
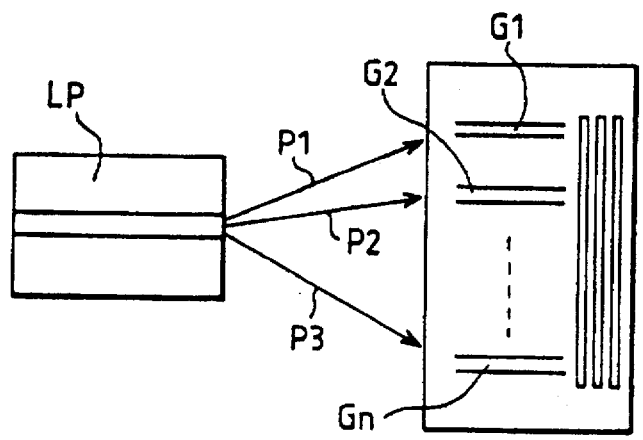

FIGS. 3a and 3b show a set of lasers G1, G2, . . . , G3 made on one and the same substrate with the diffraction gratings R1, R2, . . . , R3. These gratings may furthermore be made as one and the same grating (see FIG. 3b).

FIG. 3b gives a schematic view of the lasers G1, G2, . . . , Gn pumped by a laser LP emitting a pump beam P1, P2, . . . , P3 towards each of them.

The electrical insulation of the lasers may possibly be achieved conventionally by a technique for the implantation of protons on those parts of the plate that do not require any optical gain, and hence do not require any electrical injection.

It is possible, as the case may be, to avoid the recombination of carriers on the surface defects introduced by the etching of the photonic bandgap materials by carrying out an interdiffusion assisted by foreign atoms (boron for example). For this purpose, a small interdiffusion thickness (for example 50 to 100 angstroms) suffices.

It is also possible to provide for electrical coupling between the different lasers so that they all emit in phase G1, G2, . . . , Gn. For this purpose, the width of each band between two lasers is sized to enable this coupling. For example, it will comprise one to five meshes of photonic bandgap material. This constitutes a means that may be used in order that all the lasers emit in phase.

The invention has the following advantages:

A first advantage lies in the better quality of the optical interfaces obtained by means of the photonic bandgap materials. In such a material, the optical surface defects couple the optical mode of the laser only to evanescent modes in the photonic bandgap material and hence not to the exterior. The photonic bandgap materials therefore enable the making of perfect optical surfaces without undesirable losses towards external modes. These mirrors are, in particular, far better than the mirrors usually made with solid plate technologies, for example by reactive ion etching, which show many defects.

A second advantage of this invention lies in the inhibition of the spontaneous transmission obtained by means of the photonic bandgap material. If standard flat mirrors (metal or multilayer mirrors) are positioned below and above the structure, the control of the spontaneous transmission is obtained on all the modes of the electromagnetic field, on all three dimensions. Thus, the efficiency of the lasers is improved. This also opens up the possibility of lowering their threshold especially for the small cavities, hence for low power lasers.

What is claimed is:

1. A semiconductor laser comprising at least one active layer sandwiched between two confinement layers, namely one layer with P doping and one layer with N doping, to form a PN junction, wherein said laser comprises, in at least one of the confinement layers and/or the active layer, holes positioned on each side of the cavity so that structures of photonic bandgap material are made along the lateral walls of the cavity and at two ends of the cavity.

2. A semiconductor laser according to claim 1, comprising a diffraction grating positioned perpendicularly to the longitudinal direction of the cavity, this grating being positioned on the output end side of the laser.

3. A semiconductor laser according to claim 1, wherein the depth of the holes in the confinement layer is such that the distance from the bottom of the holes to the active layer is smaller than the operating length $\lambda$ of the laser.

4. A semiconductor laser according to claim 1, wherein the number of periods of holes is smaller at one end than at the other end.

5. A semiconductor laser according to claim 1, wherein the holes and the different meshes of the photonic bandgap material have dimensions such that the holes fill up 10% to 90% of the surface of the material.

6. A semiconductor laser according to claim 5, wherein the holes fill about 70% of the surface of the material.

7. A semiconductor laser according to claim 5, wherein the distance between holes ranges substantially from 0.2 $\lambda$ to 0.5 $\lambda$, $\lambda$ being the wavelength of operation of the laser.

8. A semiconductor laser according to claim 2, comprising several parallel-connected lasers.

9. A semiconductor laser according to claim 8, comprising a diffraction grating common to all the lasers.

10. A semiconductor laser according to claim 8, wherein the width of photonic bandgap material between two lasers corresponds substantially to 1 to 5 meshes of the network of the photonic bandgap material to enable a coupling between lasers.

11. A semiconductor laser according to claim 1, wherein the holes are void of material.

\* \* \* \* \*